United States Patent
Peters et al.

(10) Patent No.: US 7,416,973 B2
(45) Date of Patent: Aug. 26, 2008

(54) METHOD OF INCREASING THE ETCH SELECTIVITY IN A CONTACT STRUCTURE OF SEMICONDUCTOR DEVICES

(75) Inventors: Carsten Peters, Dresden (DE); Heike Salz, Radebeul (DE); Ralf Richter, Dresden (DE); Matthias Schaller, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 179 days.

(21) Appl. No.: 11/538,111

(22) Filed: Oct. 3, 2006

(65) Prior Publication Data

US 2007/0178685 A1 Aug. 2, 2007

(30) Foreign Application Priority Data

Jan. 31, 2006 (DE) .................. 10 2006 004 412

(51) Int. Cl.
H01L 21/302 (2006.01)
H01L 21/331 (2006.01)
H01L 21/44 (2006.01)
H01L 21/4763 (2006.01)

(52) U.S. Cl. .................. 438/627; 438/710; 438/711; 438/717; 438/723; 438/733; 257/774; 257/E21.252; 257/E21.256; 257/E21.577; 257/E21.579; 257/E21.495

(58) Field of Classification Search .................. 438/312, 438/597, 673, 711, 717, 725, 733; 257/774, 257/E21.495, E21.252, E21.256, E21.577, 257/E21.579

See application file for complete search history.

(56) References Cited

U.S. PATENT DOCUMENTS

| | | | |
|---|---|---|---|
| 4,844,776 A | 7/1989 | Lee et al. ...................... 156/21 |
| 5,940,735 A | 8/1999 | Mehta et al. .................. 438/21 |
| 6,228,761 B1 | 5/2001 | Ngo et al. ...................... 438/21 |
| 6,258,683 B1 | 7/2001 | Besser et al. ................... 438/21 |
| 6,440,863 B1 * | 8/2002 | Tsai et al. .................... 438/710 |
| 6,479,873 B1 | 11/2002 | Yoshiyama et al. ........... 257/29 |
| 6,483,153 B1 | 11/2002 | Hui et al. ...................... 257/29 |
| 2002/0086487 A1 * | 7/2002 | Chung ......................... 438/312 |
| 2007/0178685 A1 * | 8/2007 | Peters et al. ................. 438/597 |
| 2007/0281469 A1 * | 12/2007 | Clevenger et al. ........... 438/627 |

FOREIGN PATENT DOCUMENTS

EP 0746017 A2 4/1996

* cited by examiner

Primary Examiner—Michael S. Lebentritt
(74) Attorney, Agent, or Firm—Williams, Morgan & Amerson, P.C.

(57) ABSTRACT

By providing an additional silicon dioxide based etch stop layer, a corresponding etch process for forming contact openings for directly connecting polysilicon lines and active areas may be controlled in a highly reliable manner. In another aspect, the etch selectivity of the contact structure may be increased by a modification of the etch behavior of the exposed portion of the contact etch stop layer.

10 Claims, 5 Drawing Sheets

METHOD OF INCREASING THE ETCH SELECTIVITY IN A CONTACT STRUCTURE OF SEMICONDUCTOR DEVICES

BACKGROUND OF THE INVENTION

1. Field of the Invention

The present invention relates to the field of semiconductor manufacturing, and, more particularly, to the formation of an interconnect structure having a contact plug for directly connecting a gate line with a drain/source region of a transistor.

2. Description of the Related Art

Semiconductor devices, such as advanced integrated circuits, typically contain a large number of circuit elements, such as transistors, capacitors, resistors and the like, which are usually formed in a substantially planar configuration on an appropriate substrate having formed thereon a crystalline semiconductor layer. Due to the large number of circuit elements and the required complex layout of modern integrated circuits, the electrical connections of the individual circuit elements may generally not be established within the same level on which the circuit elements are manufactured, but require one or more additional "wiring" layers, which are also referred to as metallization layers. These metallization layers generally include metal-containing lines, providing the inner-level electrical connection, and also include a plurality of inter-level connections, which are also referred to as "vias," that are filled with an appropriate metal and provide the electrical connection between two neighboring stacked metallization layers.

To establish the connection of the circuit elements with the metallization layers, an appropriate vertical contact structure is provided that connects to a respective contact region of a circuit element, such as a gate electrode and the drain/source regions of transistors, and to a respective metal line in the first metallization layer. The contact plugs and regions of the contact structure are formed in an interlayer dielectric material that encloses and passivates the circuit elements. In some circuit configurations, a connection of individual areas of a circuit element with other individual areas of the same or other circuit elements, such as a connection from a gate electrode or a polysilicon line to an active semiconductor region, such as a drain/source region, may be established by means of the contact structure on the basis of respective contact regions. One example in this respect is the wiring scheme of certain memory devices in which respective contact trenches, frequently called CAREC contacts, connect the gate electrode or polysilicon lines with a drain/source region.

During the formation of respective contact regions directly connecting individual contact regions of circuit elements, however, a plurality of issues may arise, in particular for highly advanced semiconductor devices having critical feature sizes of 100 nm and even less. With reference to FIGS. 1a-1d, a typical conventional process flow for forming respective contact regions for directly connecting polysilicon lines or gate electrodes with respective active semiconductor regions, i.e., drain/source regions, will be described in more detail in order to more clearly demonstrate the problems involved therein.

Figure 1A:
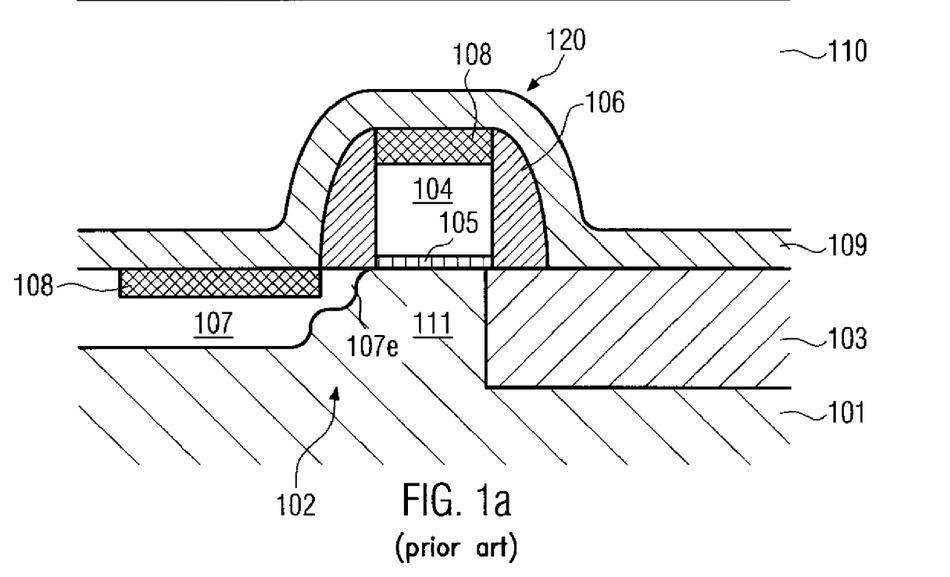
FIGS. 1a-1b schematically show cross-sectional views of a conventional semiconductor device during the formation of a contact region for directly connecting a polysilicon line and a drain/source region during various manufacturing stages in accordance with conventional techniques, resulting in an increased risk for leakage currents or short circuits.

FIG. 1a schematically shows a semiconductor device 100, which may represent any appropriate circuit, in which a direct contact region, a so-called CAREC, may be formed to connect adjacent circuit regions. The semiconductor device 100 may comprise a substrate 101, which may represent any appropriate substrate, such as a bulk silicon substrate, a silicon-on-insulator (SOI) substrate and the like. The substrate 101 has formed thereon a substantially crystalline semiconductor layer 102 on and in which respective circuit elements are formed, one of which is indicated as element 120. A trench isolation 103 may be formed within the semiconductor layer 102 to define an active semiconductor region 111, which is to be understood as a doped semiconductor region, in which at least a portion is configured in substantially the same way as a drain or source region of a field effect transistor of the device 100. Consequently, the active region 111 may comprise implanted areas 107, 107e, which may be conveniently referred to as drain/source regions 107 with respective extension regions 107e. Moreover, the device 100 may comprise a polysilicon line 104, which may be formed above the active region 111 and which may be separated therefrom by an insulation layer 105, wherein the polysilicon line 104 may be substantially formed according to design criteria as are also used for the formation of gate electrode structures in the device. On side-walls of the polysilicon line 104, respective sidewall spacers 106 may be formed which are typically comprised of silicon nitride. Respective metal silicide regions 108 may be formed on top of the polysilicon line 104 and in the drain/source region 107, and a contact etch stop layer 109, typically comprised of silicon nitride, may be formed on the active region 111 and the polysilicon line 104 including the sidewall spacers 106. Finally, an interlayer dielectric material 110 may be formed above the circuit element 120 represented by the polysilicon line 104 and the active region 111 so as to enclose and passivate the circuit element 120.

A typical process flow for forming the semiconductor device 100 as shown in FIG. 1a may comprise the following processes. The insulation layer 105 and the polysilicon line 104 may be formed on the basis of well-established oxidation, deposition, photolithography and etch techniques, wherein lateral dimensions of the polysilicon line 104 may be formed in accordance with device requirements, wherein, in sophisticated devices, the lateral dimension may be approximately 100 nm and even less. Thereafter, the sidewall spacers 106 may be formed by well-established deposition and anisotropic etch techniques, wherein, prior to and after the formation of the sidewall spacer 106, which may be comprised of a plurality of spacer elements, appropriate implantation processes may be performed in order to form the source/drain region 107 including the extension region 107e.

Next, the metal silicide regions 108 may be formed, for instance, by depositing an appropriate refractory metal and initiating a silicidation process on the basis of an appropriate heat treatment. After the removal of any excess material, the contact etch stop layer 109 may be formed on the basis of well-established plasma enhanced chemical vapor deposition (PECVD) techniques followed by the deposition of the interlayer dielectric material 110, which is typically comprised of silicon dioxide. After any planarization processes, such as chemical mechanical polishing (CMP) and the like, for providing a substantially planar surface of the interlayer dielectric material 110, an appropriate photolithography process may be performed on the basis of a corresponding photolithography mask in order to form a resist mask (not shown) having respective openings corresponding to respective contact openings to be formed above the polysilicon line 104 and the drain/source region 107 to establish a direct electric connection therebetween. Based on a corresponding resist mask, an anisotropic etch process may be performed, which may then be stopped in and on the contact etch stop layer 109 due to the high etch selectivity of the corresponding etch recipe for etching through the silicon dioxide material of the layer 110.

Subsequently, a further etch step may be performed to open the contact etch stop layer 109 in order to contact the polysilicon line 104, i.e., the respective metal silicide region 108 formed thereon, and the drain/source region 107, i.e., the corresponding metal silicide region 108 formed therein. During the respective etch process, the sidewall spacers 106, at least at the side of the drain/source region 107, may also be completely removed, since the contact etch stop layer 109 and the spacers 106 are comprised of the same material and a certain degree of over-etch is required to reliably expose the respective metal silicide regions 108. Consequently, during this over-etch time, the etch front may also attack, after having removed the sidewall spacer 106, the extension region 107e so that the etch front may penetrate the extension region 107e to a certain degree, thereby possibly creating a short to the remaining active region 111 or at least providing a significant risk of increased leakage currents of the resulting electric connection.

Figure 1B:
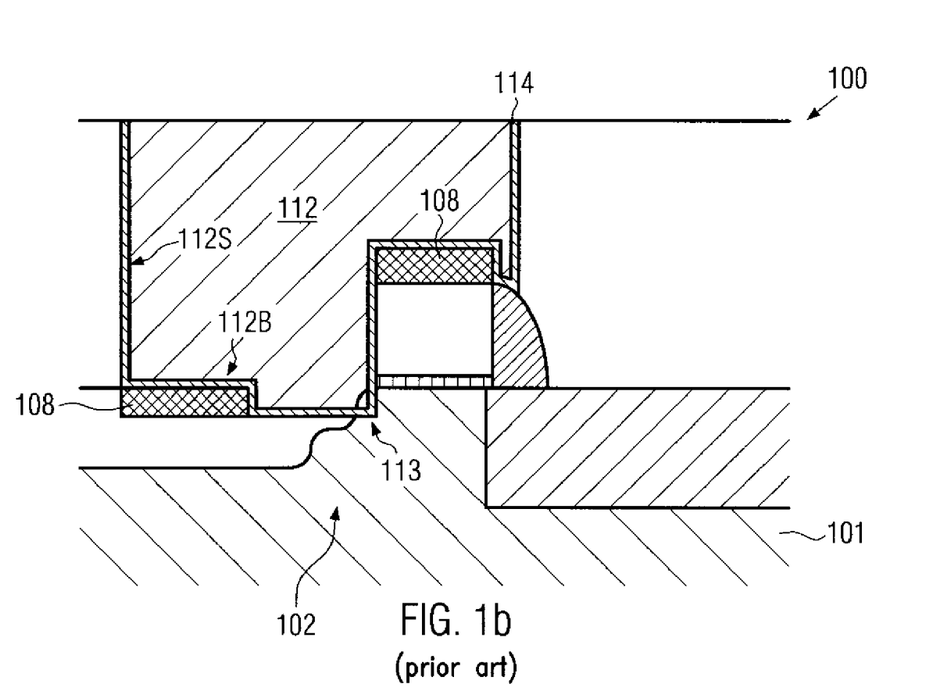

FIG. 1b schematically shows the semiconductor device 100 after the completion of the above-described process sequence. Moreover, the semiconductor device 100 comprises a contact region 112, which may be filled with a conductive material, such as tungsten, wherein, at sidewall portions 112S and bottom portions 112B, a conductive barrier material, such as titanium and the like, may be provided. Since the contact region 112 is connected to the respective metal silicide regions 108 of the polysilicon line 104 and the drain/source region 107, a direct electrical connection between these two device areas is established. Moreover, as previously indicated, the etch process for forming a respective contact opening in the interlayer dielectric material 110 and the contact etch stop layer 109 may have created a recess 113 in the extension region 107e, which may even extend into the active region 111 below the extension region, which may be referred to as a well region, thereby possibly creating a short or at least a current path for increased leakage currents. Subsequently, the contact region 112 may be formed on the basis of well-established recipes, comprising for instance the deposition of the barrier layer 114 in accordance with well-established chemical vapor deposition (CVD), physical vapor deposition (PVD) techniques, followed by any appropriate fill technique, such as CVD on the basis of appropriate precursor materials. Thereafter, any excess material of the barrier material and the conductive material comprising the contact region 112 may be removed and a further passivation layer may be deposited.

As a result, the conventional technique may lead to increased leakage currents or even short circuits between portions 113 of the active region 111 that are inversely doped with respect to the drain/source regions 107 and the extension regions 107e, thereby significantly negatively affecting the performance of the device 100.

In view of the situation described above, there exists a need for an enhanced technique that may enable the formation of contact regions for directly connecting contact regions of circuit elements within the contact structure while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of contact structures including direct connections between adjacent contact regions of circuit elements, such as CAREC contacts, wherein an increased reliability with respect to the mechanical integrity as well as in view of short circuits and leakage currents may be achieved, while a high degree of compatibility to the conventional process flow as described above may be maintained. For this purpose, an additional etch stop layer on the basis of silicon oxide may be formed to increase the etch selectivity during the etch process for forming respective contact openings within the interlayer dielectric material and the contact etch stop layer. In another approach, the etch rate of the contact etch stop layer may be modified prior to patterning the contact etch stop layer in order to reduce the probability for creating etch damage in the active semiconductor region.

According to one illustrative embodiment of the present invention, a method comprises forming an etch stop layer comprising silicon dioxide above a circuit element comprising a conductive line and an active semiconductor region. A contact etch stop layer is then formed on the etch stop layer and an interlayer dielectric material is formed above the circuit element and the contact etch stop layer. Moreover, a contact opening is formed in the interlayer dielectric material by an etch process using the contact etch stop layer as an etch stop, wherein the contact opening connects the conductive line and the active semiconductor region. The method further comprises removing the contact etch stop in the contact opening using the etch stop layer as an etch stop, and removing the etch stop layer within the contact opening. Finally, the contact opening is filled with a conductive material.

According to another illustrative embodiment of the present invention, a method comprises forming a contact etch stop layer above a circuit element comprising a conductive line and an active semiconductor region. Then, an interlayer dielectric material is formed above the circuit element and the contact etch stop layer. Furthermore, the method comprises forming a contact opening in the interlayer dielectric material by an etch process using the contact etch stop layer as an etch stop, wherein the contact opening connects the conductive line and the active semiconductor region. Next, the etch rate of a portion of the contact etch stop layer exposed in the contact opening is modified and the exposed portion of the contact etch stop is removed in the contact opening. Finally, the contact opening is filled with a conductive material.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention relates to a technique for the formation of contact regions, i.e., metal-filled regions within an interlayer dielectric layer, for electrically connecting respective contact regions of circuit elements, such as field effect transistors, polysilicon lines, active regions and the like, in a direct fashion, i.e., without an electrical contact via the first metallization layer, wherein an increased reliability during the formation of a respective contact opening may be achieved in some illustrative embodiments due to the provision of an additional silicon dioxide based etch stop layer so as to reduce an adverse etch attack of exposed silicon areas during the contact opening etch. In other illustrative embodiments, the undue removal of spacer material may be reduced by modifying the etch rate of the contact etch stop layer prior to the removal thereof. The present invention is highly advantageous in the context of sophisticated integrated circuits having transistor elements with a gate length of 100 nm and even less, since such elements have extremely tight process margins with respect to junction depth and the like, which may significantly increase the risk for leakage currents or short circuits, as is previously explained. It should be appreciated, however, that the present invention may also be applied to less critical applications and the invention should not be construed as being restricted to any specific device dimensions, unless such restrictions are explicitly set forth in the following detailed description as well as in the appended claims.

Figure 2A:
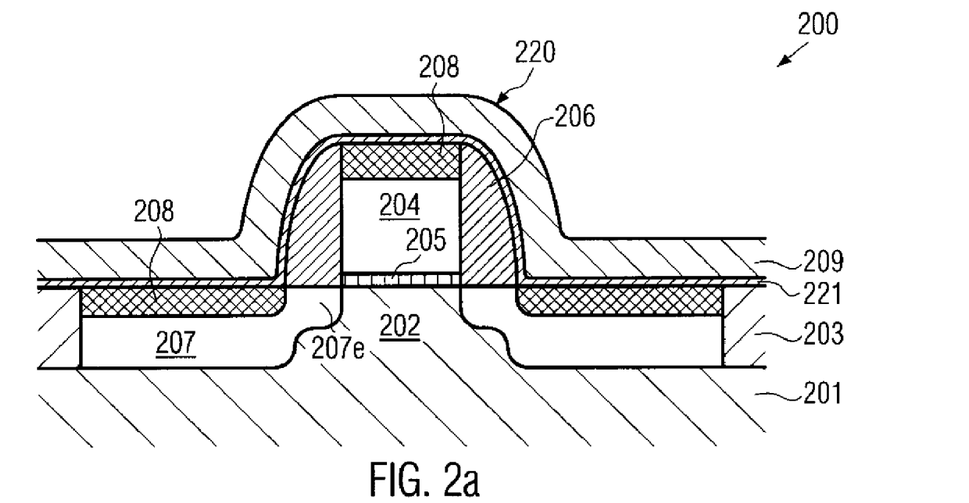
FIGS. 2a-2c schematically show cross-sectional views of a semiconductor device including a circuit element and a contact region for a direct connection of certain contact regions of the circuit elements during various manufacturing stages in accordance with illustrative embodiments of the present invention, in which an additional silicon dioxide based etch stop layer is formed prior to the deposition of the interlayer dielectric material.
Figure 2B:
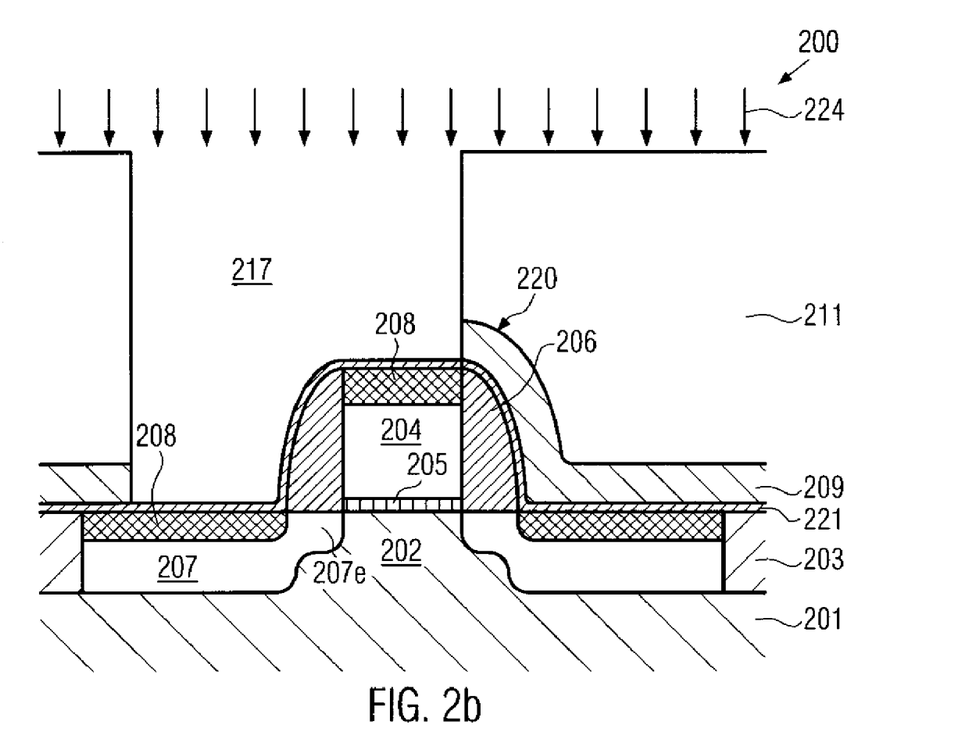
Figure 2C:
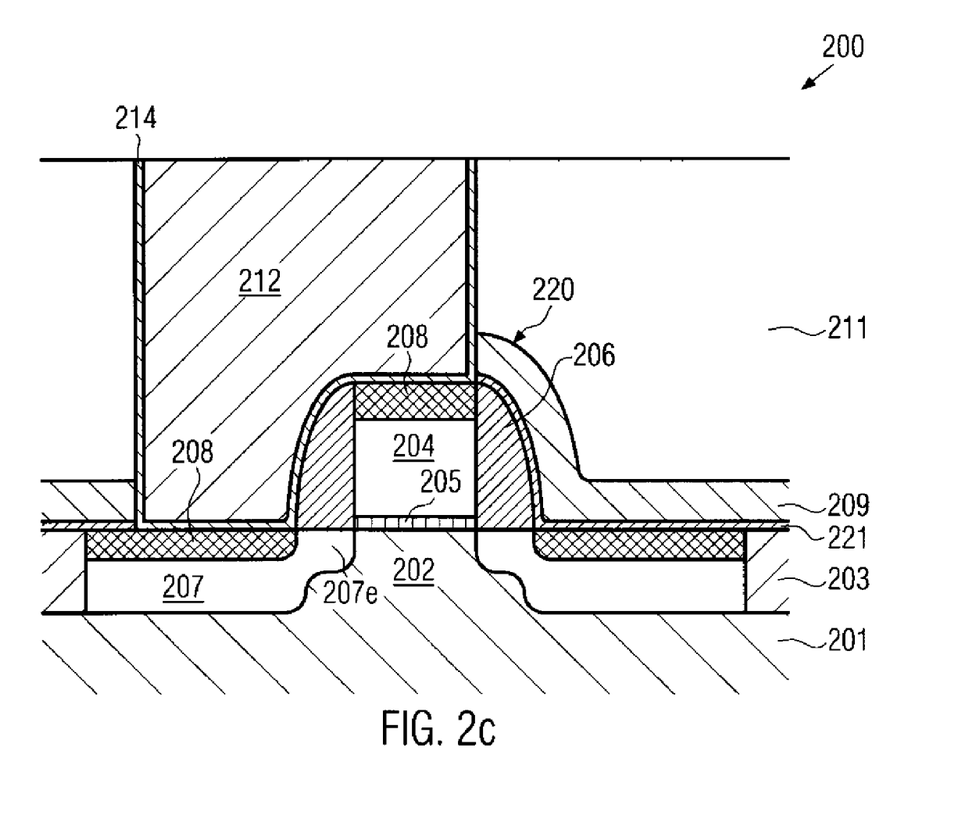

With reference to FIGS. 2a-2c, further illustrative embodiments of the present invention will now be described in more detail. In FIG. 2a, a semiconductor device 200 comprises a substrate 201 having formed thereabove a semiconductor layer 202 in and on which is formed a circuit element 220. The circuit element 220 may comprise a conductive line 204, in some illustrative embodiments in the form of a gate electrode, which is separated from the semiconductor layer 202 by an insulating layer 205, such as a gate insulation layer. Moreover, respective spacers 206 may be formed at the sidewalls of the conductive line 204. Active regions, such as drain/source regions, 207, which may include respective extension regions 207e for advanced field effect transistors, may be formed within the semiconductor layer 202. The circuit element 220 may have formed in the active regions or drain/source regions 207 and the conductive line or gate electrode 204 metal silicide regions 208. Contrary to conventional devices, an etch stop layer 221 may be formed above the circuit element 220, followed by a contact etch stop layer 209. In one embodiment, the etch stop layer 221 may be formed above the entire device 200, thereby also covering other circuit elements (not shown), while in other embodiments the layer 221 may be selectively formed in an area of the device 200 in which the circuit element 220 is located, while other circuit elements, such as transistor elements of high switching speed, may not be covered by the layer 221. For example, in some applications, a contact etch stop layer, such as the layer 209, may be provided with a high intrinsic stress, thereby modifying the charge carrier mobility in the respective transistors. Thus, in view of a high efficiency in transferring the stress into the respective channel region, it may be advantageous to omit the additional etch stop layer in these transistors, while the circuit elements of the same type as the circuit element 220 may selectively receive the additional etch stop layer 221.

The etch stop layer 221 may be formed of any appropriate silicon dioxide based material having a high etch selectivity with respect to the contact etch stop layer 209, which in one illustrative embodiment may be comprised of silicon nitride, thereby providing a high degree of process compatibility with the conventional process flow, as previously described with reference to FIGS. 1a-1b.

The semiconductor device 200 as shown in FIG. 2a may be formed in accordance with well-established recipes, wherein similar processes may be used as previously described with reference to the device 100. However, an additional deposition step may be performed after completing the circuit element 220, that is, after the formation of the metal silicide regions 208 in the conductive line 204 and the active regions 207, wherein the sidewall spacer 206 may act as a reaction mask. The deposition of the etch stop layer 221 may be accomplished on the basis of established deposition techniques, such as PECVD and the like. As previously described, in some illustrative embodiments, the layer 221 may be selectively formed to cover the circuit element 220, while exposing other circuit elements (not shown), such as advanced transistor devices, which may be provided in logic areas of the device 200, when, for instance, advanced CPUs are considered. To this end, the layer 221 may be selectively removed after deposition by an appropriate resist mask on the basis of well-established etch recipes. In other embodiments, a resist mask may be formed prior to the deposition, and the subsequent deposition process may be performed on the basis of process parameters that may be compatible with the characteristics of the resist mask. After the deposition, the resist mask covered by the silicon based material may be removed, thereby leaving the circuit element 220 covered by the layer 221.

After the deposition of the layer 221, the contact etch stop layer 209 may be formed on the basis of well-established deposition techniques, such as PECVD and the like. In some illustrative embodiments, the contact etch stop layer 209 may be formed with a high intrinsic stress, which may range, for instance, from approximately 1.5 GPa compressive stress to approximately 1.5 GPa tensile stress, or higher. A corresponding high intrinsic stress may be accomplished by suitably adjusting the deposition parameter values during a plasma assisted deposition process with respect to, for instance, pressure, temperature, degree of ion bombardment and the like.

FIG. 2b schematically illustrates the semiconductor device 200 after the completion of the above-described process sequence and in a further advanced manufacturing stage. Here, the device 200 comprises a contact opening 217 within an interlayer dielectric material 211, wherein the contact etch stop layer 209 is already opened.

The opening 217 may be formed on the basis of anisotropic etch processes as are also described with respect to the conventional process flow. Due to the high etch selectivity of the etch stop layer 221 with respect to the contact etch stop layer 209, the circuit element 220 is, contrary to the conventional technique, reliably protected during the respective etch process. Subsequently, the device 200 is subjected to a further etch process 224 for removing an exposed portion of the etch stop layer 221. For this purpose, any well-established wet chemical etch recipes or dry etch processes may be performed, as are well-established for silicon dioxide based materials. After the removal of the exposed portion of the etch stop layer 221 and any optional cleaning processes, the further processing may be continued on the basis of a well-established process including the deposition of a barrier material and the filling in of a contact metal.

FIG. 2c schematically shows the semiconductor device 200 with a contact region 212 comprising a barrier layer 214 and an appropriate metal, such as tungsten. Consequently, due to the provision of the etch stop layer 221, a direct electrical connection from the conductive line 204 to the active semiconductor region 207 may be established substantially without a risk of forming electrical shortcuts or creating any electrical paths for increased leakage currents.

As a result, an enhanced technique is provided which enables the formation of contact regions, such as so-called CAREC contacts, which provide a direct electrical connection of contact regions of circuit elements within an interlayer dielectric material without contact to the first metallization layer. Due to the provision of the additional etch stop layer, undue material removal from the sidewall spacer 206 may be suppressed, thereby reducing the probability for creating leakage paths.

With reference to FIGS. 3a-3d, further illustrative embodiments will now be described in more detail, wherein high compatibility with the conventional processing may be maintained, while nevertheless a reduction of leakage paths may be achieved.

Figure 3A:
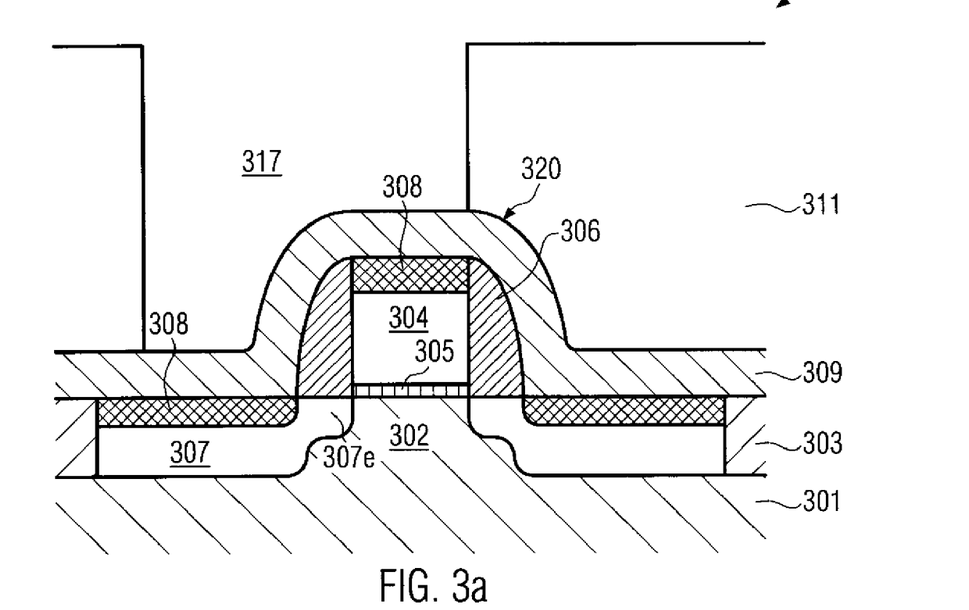
FIGS. 3a-3d schematically show cross-sectional views of a semiconductor device during the formation of a contact portion, wherein the etch rate of the contact etch stop layer is modified prior to the patterning of the contact etch stop layer according to further illustrative embodiments of the present invention.

In FIG. 3a, a semiconductor device 300 comprises a substrate 301 having formed thereabove a semiconductor layer 302 in and on which is formed a circuit element 320. The circuit element 320, which in one illustrative embodiment may represent a field effect transistor, may comprise a conductive line 304, in some illustrative embodiments in the form of a gate electrode, which is separated from the semiconductor layer 302 by an insulating layer 305, such as a gate insulation layer. Moreover, respective spacers 306 may be formed at the sidewalls of the conductive line 304. Active regions, such as drain/source regions, 307, which may include respective extension regions 307e for advanced field effect transistors, may be formed within the semiconductor layer 302. The circuit element 320 may have formed in the active regions or drain/source regions 307 and the conductive line or gate electrode 304 metal silicide regions 308. A contact etch stop layer 309 is formed above the circuit element 320, and, in one illustrative embodiment, the layer 309 is formed on the metal silicide regions 308. As described above, depending on device requirements, in some embodiments, the contact etch stop layer 309 may be provided with a high intrinsic stress, thereby modifying the charge carrier mobility in the respective transistors. Thus, in view of a high efficiency in transferring the stress into the respective channel region, it may be advantageous to form the contact etch stop layer directly on the circuit element 320. An interlayer dielectric material 311 is formed on the contact etch stop layer 309 and comprises a contact opening 317 to connect the active region 307 and the conductive line 304.

The semiconductor device 300 as shown in FIG. 3a may be formed according to well-established process techniques as are also described with reference to the devices 100 and 200, wherein, however, the additional etch stop layer 221 (FIGS. 2a-2c) may be omitted.

Figure 3B:
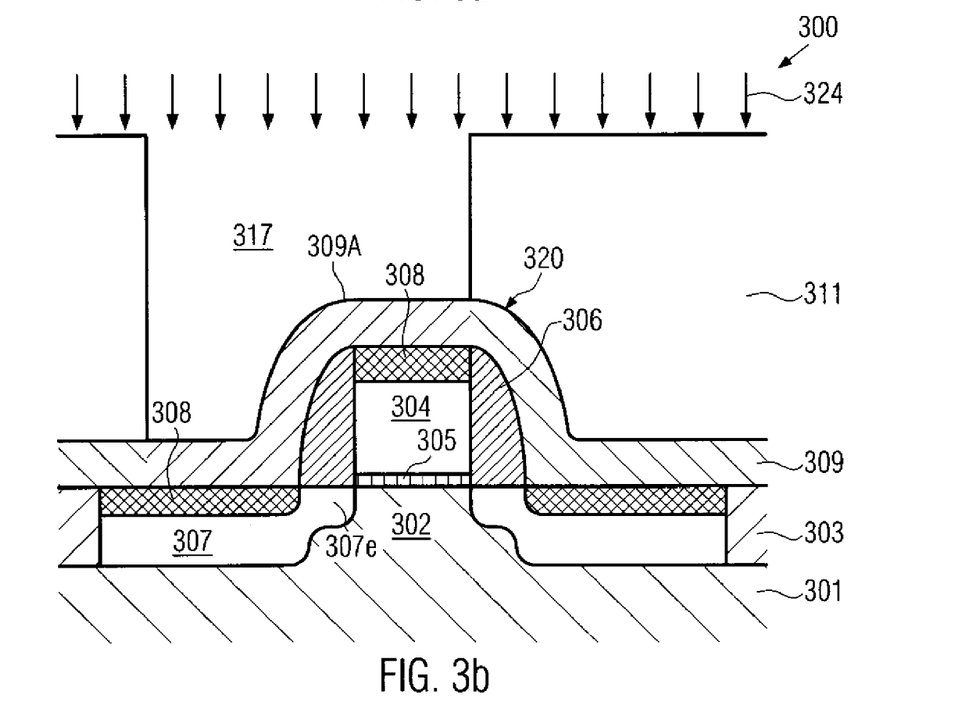

FIG. 3b schematically depicts the semiconductor device 300 in a further advanced manufacturing stage, wherein the device 300 is exposed to a treatment 324 for modifying the etch behavior of an exposed portion 309A of the contact etch stop layer 309. Thus, the exposed portion 309A may have a significantly higher etch rate with respect to a specified etch process to be performed subsequently to remove the portion 309A for forming a respective contact region. In some illustrative embodiments, the contact etch stop layer 309 and the sidewall spacers 306 may be comprised of similar materials, such as silicon nitride and the like, wherein, in conventional approaches, these components may have a similar etch rate with respect to an etch process for opening a contact etch stop layer, as is described above. However, due to the treatment 324, the portion 309A may exhibit the higher etch rate, wherein the modified etch rate is produced in a self-aligned manner, substantially without affecting other characteristics of the device 300. The treatment 324 may, in one illustrative embodiment, comprise an ion bombardment in order to modify the structure of the portion 309A, thereby providing an increased number of diffusion paths for the subsequent etch ambient. In one illustrative embodiment, the ion bombardment is established by using inert ions, such as xenon or other noble gas ions. The ions may be provided by an ion implantation process using standard implantation tools, wherein suitable process parameter values may be obtained on the basis of simulation and/or experiment. For example, an implantation energy for xenon ions in a range of several keV up to several hundred keV may be used in order to locate the ions in an appropriate depth, substantially without unduly affecting the metal silicide regions 308. Thus, by selecting an appropriate implantation energy with a dose, such as $10^{13}$-$10^{16}$ ions/cm$^2$, the structure of the portion 309A may be effectively modified, while lower-lying regions, such as the spacers 306, may not be substantially affected. During the treatment 324, the interlayer dielectric material 311 may act as a mask so that the process 324 is self-aligned.

Figure 3C:
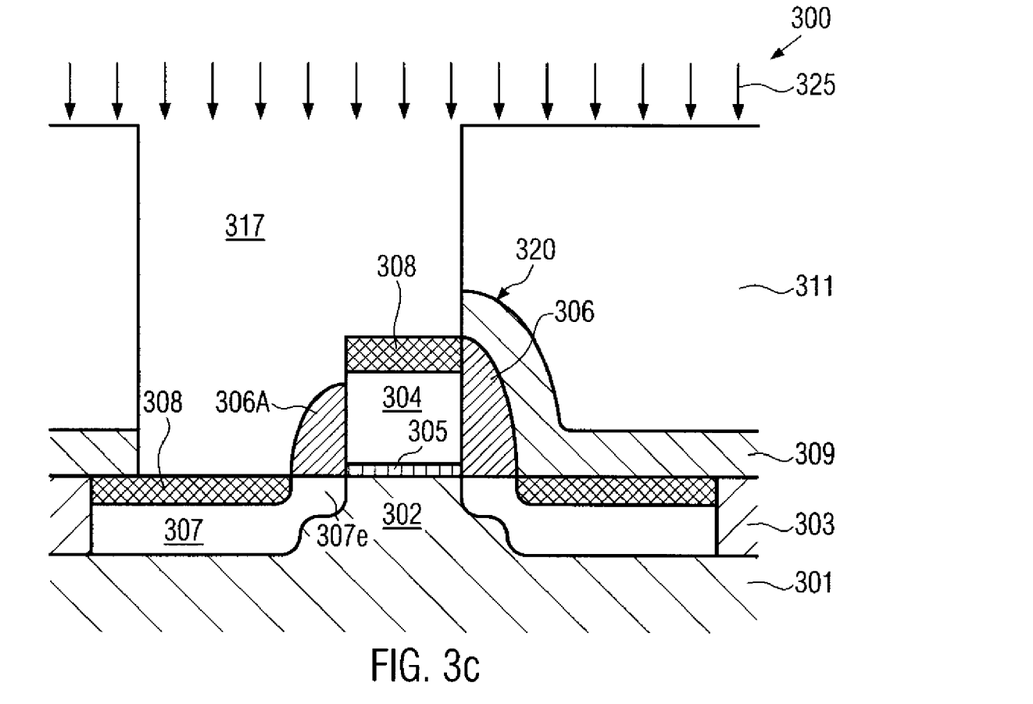

FIG. 3c schematically illustrates the semiconductor device 300 in a further advanced manufacturing stage. As shown, the device 300 is exposed to an etch process 325 for removing the portion 309A, wherein the process 325 may be performed on the basis of established recipes, as is previously described. During the process 325, the modified portion 309A may have a higher etch rate compared to the spacer 306, even if the spacer 306 and the layer 309 are initially made of substantially the same material. Consequently, the portion 309A may be removed at a high rate so that the metal silicide portions 308 may be exposed more efficiently even if a certain non-uniformity across the substrate 301 may exist. Thus, the metal silicide regions 308 may be reliably exposed in a reduced etch time, which may be detected by endpoint detection, while only a reduced amount of material of the spacer 306 may be removed, thereby effectively reducing the risk for forming leakage paths in the semiconductor area below the spacer 306. Hence, after completion of the etch process 325, the spacer 306 may be reduced in size, now indicated as 306A, while nevertheless covering the underlying semiconductor region. Thereafter, the further processing may be continued on the basis of established recipes, i.e., by forming a barrier layer and filling in a contact metal.

Figure 3D:
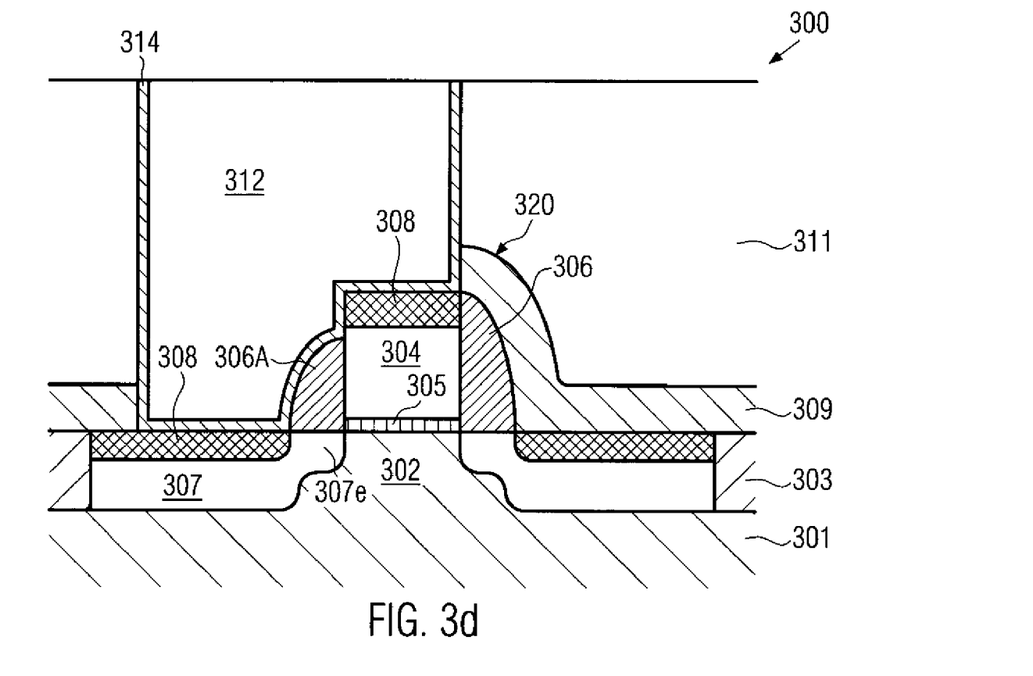

FIG. 3d schematically depicts the device 300 after the completion of the above-described process sequence. Hence, the device comprises a metal-filled contact region 312 confined by a barrier layer 314.

As a result, the device may be formed with reduced leakage paths by modifying the etch behavior of a portion of the contact etch stop layer, while conventional process strategies may be used. The additional treatment may be performed across the entire substrate, thereby also enhancing the etch rate in other contact openings. Hence, the overall increased etch rate may reduce etch non-uniformities during the opening of the contact etch stop layer due to a reduced etch time, thereby also reducing the exposure of the sidewall spacers in the devices receiving the CAREC contacts, which may significantly contribute to a reduced probability for the creation of leakage paths.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming an etch stop layer comprising silicon dioxide above a circuit element comprising a conductive line and an active semiconductor region;
    forming a contact etch stop layer on said etch stop layer;
    forming an interlayer dielectric material above said circuit element and said contact etch stop layer;
    forming a contact opening in said interlayer dielectric material by an etch process using said contact etch stop layer as an etch stop, said contact opening connecting said conductive line and said active semiconductor region;
    removing said contact etch stop in said contact opening using said etch stop layer as an etch stop;
    removing said etch stop layer within said contact opening; and
    filling said contact opening with a conductive material.

2. The method of claim 1, wherein said contact etch stop layer comprises silicon nitride.

3. The method of claim 2, wherein forming said etch stop layer comprises depositing an etch stop material above said circuit element, forming a mask layer for defining an opening above said circuit element, said opening having dimensions substantially corresponding to said contact opening, patterning said etch stop material on the basis of said mask layer and removing said mask layer.

4. The method of claim 1, further comprising forming at least one sidewall spacer adjacent to said conductive line and using said at least one sidewall spacer to form said active semiconductor region by ion implantation prior to forming said etch stop layer.

5. A method, comprising:
    forming a contact etch stop layer above a circuit element comprising a conductive line and an active semiconductor region;
    forming an interlayer dielectric material above said circuit element and said contact etch stop layer;
    forming a contact opening in said interlayer dielectric material by an etch process using said contact etch stop layer as an etch stop, said contact opening connecting said conductive line and said active semiconductor region;
    modifying an etch rate of a portion of said contact etch stop layer exposed in said contact opening;
    removing said exposed portion of the contact etch stop in said contact opening; and
    filling said contact opening with a conductive material.

6. The method of claim 5, wherein said exposed portion of the contact etch stop layer is modified by a treatment on the basis of ion irradiation.

7. The method of claim 6, wherein said treatment comprises an ion implantation.

8. The method of claim 7, wherein said ion implantation is performed using a an inert ion species.

9. The method of claim 8, wherein said inert ion species comprises xenon ions.

10. The method of claim 5, wherein said circuit element represents a field effect transistor.

* * * * *